United States Patent
Tai et al.

(10) Patent No.: US 7,626,808 B2
(45) Date of Patent: Dec. 1, 2009

(54) DISPLAY DEVICE HAVING ANTI-FOG TRANSPARENT PROTECTION PLATE

(75) Inventors: Lone-Wen Tai, Taipei Hsien (TW); James Juehui Hong, Shenzhen (CN); Zi-Li Wu, Shenzhen (CN); Jun Dai, Shenzhen (CN); Hai-Xia Su, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 183 days.

(21) Appl. No.: 11/746,646

(22) Filed: May 10, 2007

(65) Prior Publication Data

US 2008/0158799 A1    Jul. 3, 2008

(30) Foreign Application Priority Data

Dec. 29, 2006   (CN)   .................... 2006 1 0201474

(51) Int. Cl.
*H05K 5/00*   (2006.01)
*H05K 7/00*   (2006.01)

(52) U.S. Cl. ..................... 361/679.21; 361/679.22; 361/679.26

(58) Field of Classification Search ............... 361/681, 361/679.21, 679.22, 679.26
See application file for complete search history.

(56) References Cited

U.S. PATENT DOCUMENTS

| | | | |
|---|---|---|---|
| 6,088,069 A * | 7/2000 | Farlow | 349/12 |
| 6,538,709 B1 * | 3/2003 | Kurihara et al. | 349/58 |
| 7,423,377 B2 * | 9/2008 | Kim et al. | 313/582 |
| 2004/0201347 A1 * | 10/2004 | Park et al. | 313/512 |
| 2006/0246298 A1 * | 11/2006 | Wu | 428/426 |
| 2006/0264093 A1 * | 11/2006 | Shim | 439/495 |
| 2007/0003700 A1 * | 1/2007 | Roche et al. | 427/372.2 |

* cited by examiner

*Primary Examiner*—Jayprakash N Gandhi
*Assistant Examiner*—Anthony M Haughton
(74) *Attorney, Agent, or Firm*—Frank R. Niranjan

(57) ABSTRACT

An exemplary display device (10) includes a display module (11), a frame (12), a porous metallic material member (13), and a transparent protection plate (14). The frame has a receiving cavity (121). The display module is confined in the receiving cavity of the frame. The transparent protection plate is configured in front of the light output side of the display module. The porous metallic material member is located between the front surface (122) of the frame and the transparent protection plate. The display device can prevent fogs forming on the transparent protection plate for maintaining a clear display.

16 Claims, 5 Drawing Sheets

DISPLAY DEVICE HAVING ANTI-FOG TRANSPARENT PROTECTION PLATE

CROSS-REFERENCE TO RELATED APPLICATIONS

This application is related to two co-pending U.S. patent applications, a co-pending U.S. patent applications Ser. No. 11/741,748, filed on Apr. 29, 2007, and entitled "DISPLAY DEVICE HAVING ANTI-FOG TRANSPARENT PROTECTION PLATE", and a co-pending U.S. patent applications Ser. No. 11/746,647, filed on May 10, 2007, and entitled "DISPLAY DEVICE HAVING ANTI-FOG TRANSPARENT PROTECTION PLATE" wherein the inventor is Lone-Wen Tai et al. All of such applications have the same assignee as the present application.

BACKGROUND OF THE INVENTION

1. Field of the Invention

The present invention generally relates to a display device, and more particularly to a flat-panel display device having a transparent protection plate.

2. Discussion of the Related Art

In recent years, there has been an increase demand for flat-panel display devices for use in, electronic products such as personal digital assistants, mobile phones, portable computers, televisions, etc. This is because the flat-panel display devices have a thinner structure or configuration in contrast to a cathode ray tube display device. Generally, the flat-panel display device may be a liquid crystal display device, a plasma display device, a field emission display device, an electroluminescent display device, etc. In particularly, the liquid crystal display device is typically used to represent the flat-panel display device, because the liquid crystal display devices currently have the largest market and the fastest development speed.

In a liquid crystal display device, a screen of the liquid crystal display device should be clean to see a clear display. Generally, the screen of the liquid crystal display is made of a delicate material that is easily scratched when cleaned and/or collided with a rough object.

In order to prevent the screen from being scratched, a sturdy transparent plate is generally configured on a frame of the liquid crystal display device to protect the screen. The screen of the liquid crystal display device and the rigid transparent plate are spaced apart from one another, therefore an interspace is defined between the screen and the rigid transparent plate. To avoid condensation generated on the rigid transparent plate when water vapors in the interspace comes in contact with the rigid transparent plate with a cooler temperature relative to the screen, some holes that regulate ventilation between the interspace and ambient environment is needed. However, dust particles would enter the interspace through the holes, and thus the screen of the liquid crystal display device would be contaminated.

Therefore, a new display device is desired in order to overcome the above-described shortcomings.

SUMMARY

A display device includes a frame, a display module, a transparent protection plate, and a porous metallic material member. The frame has a receiving cavity. The display module is received in the receiving cavity of the frame. The transparent protection plate is configured on the light output side of the display module. The porous metallic material member is located at an edge between the display module and the transparent protection plate.

Other novel features will become more apparent from the following detailed description, when taken in conjunction with the accompanying drawings.

BRIEF DESCRIPTION OF THE DRAWINGS

The components in the drawings are not necessarily drawn to scale, the emphasis instead being placed upon clearly illustrating principles of the present display device. Moreover, in the drawings, like reference numerals designate corresponding parts throughout several views, and all the views are schematic.

DETAILED DESCRIPTION OF THE EMBODIMENTS

Reference will now be made to the drawings to describe preferred embodiments of the present display device in detail.

Figure 1:
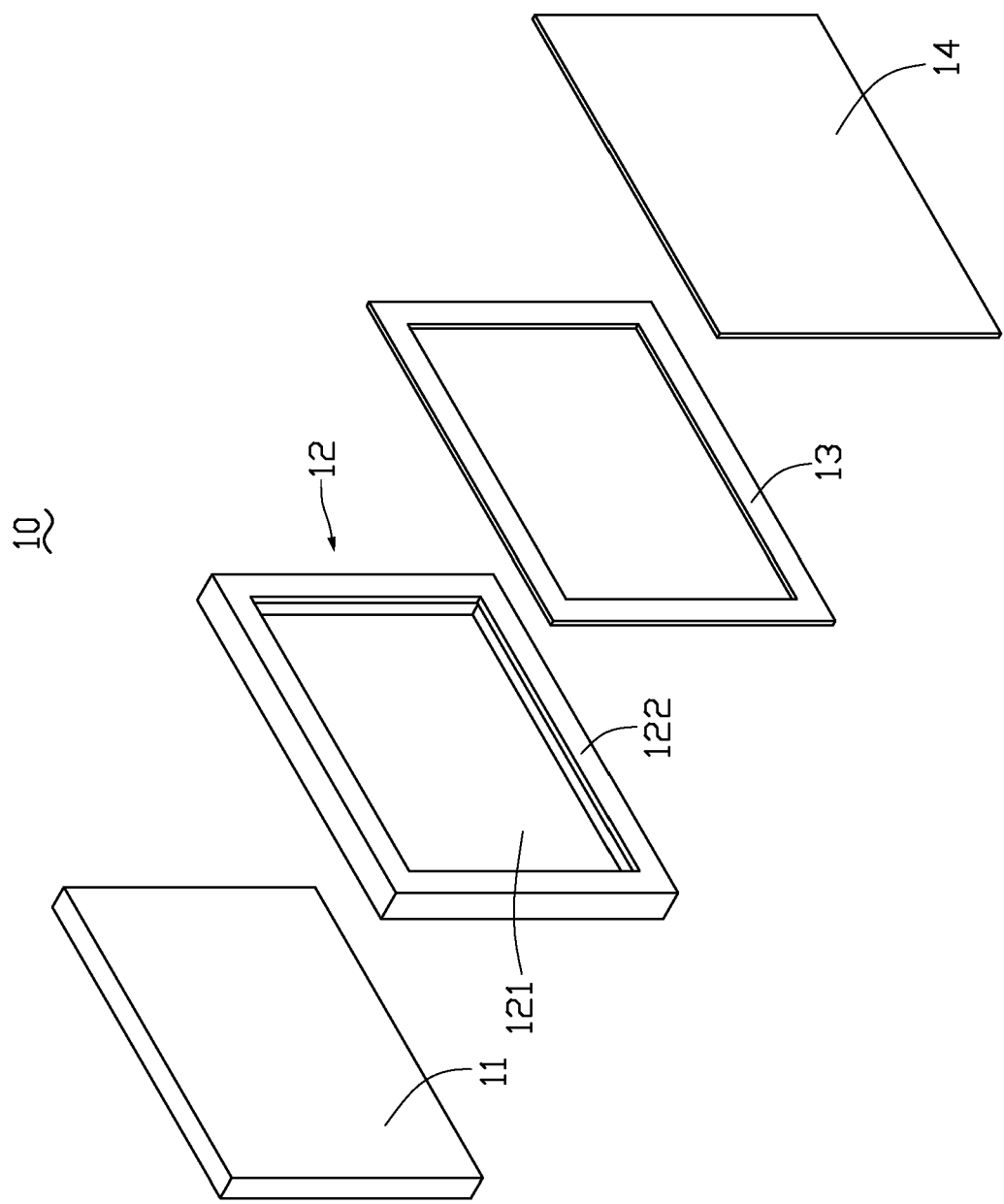
FIG. 1 is an exploded view of a display device in accordance with a first preferred embodiment of the present invention.
Figure 2:
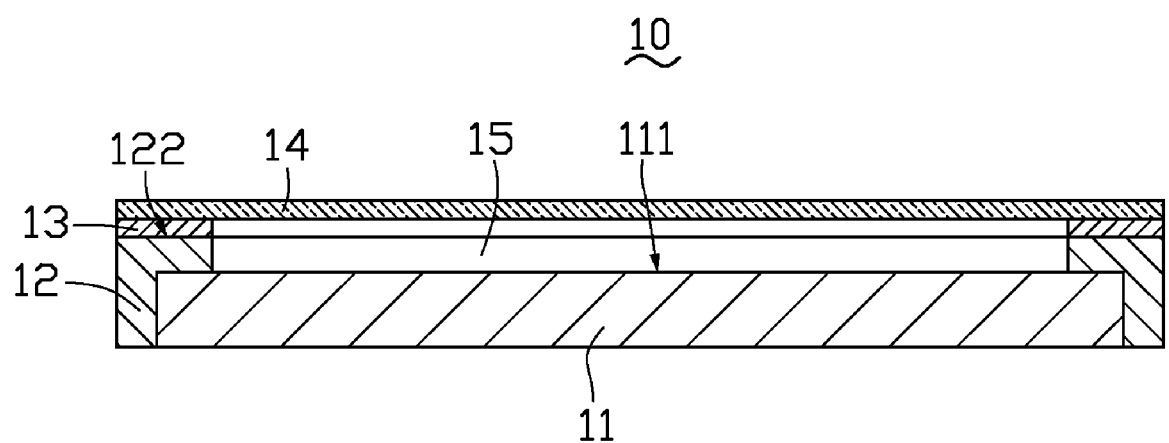
FIG. 2 is an assembled, side, cross-sectional view of the display device of FIG. 1.

Referring to FIGS. 1 and 2, a display device 10 according to a first embodiment is shown. The display device 10 includes a liquid crystal display module 11, a frame 12, a porous metallic material member 13, and a transparent protection plate 14. The liquid crystal display module 11 includes a light output surface 111. The frame 12 includes a front surface 122 and side rims extending rearwards from a periphery of the front surface 122. The front surface 122 further defines a viewing window. The front surface 122 and the side rims cooperatively define a receiving cavity 121 behind the front surface 122. After assembly, the frame 12 confines the liquid crystal display module 11 in the receiving cavity 121 of the frame 12. The transparent protection plate 14 is disposed in front of the light output surface 111 of the liquid crystal display module 11. The porous metallic material member 13 is located between the front surface 122 of the frame 12 and the transparent protection plate 14. The transparent protection plate 14 and the light output surface 111 of the liquid crystal display module 11 are spaced apart from one another, and an interspace 15 is defined between the transparent protection plate 14 and the light output surface 111 of the liquid crystal display module 11.

The transparent protection plate 14 is used for protecting the light output surface 111 of the liquid crystal display module 11 from damages by excessive force applied on it by an object. The transparent protection plate 14 can be made of a material selected from a group consisting of plastic, glass, and any suitable combination thereof.

The porous metallic material member 13 is used to regulate ventilation between the interspace 15 and the ambient environment. The porous metallic material member 13 is made of a porous metallic material or a porous composite metallic material. Typically, the porous metallic material can be made of material selected from a group consisting of aluminium alloy, ferrous alloy, nickel alloy, magnesium alloy, and any suitable combination thereof. A structure of the porous metallic material member 13 can be configured according to a shape of the front surface 122 of the frame 12. In this embodiment, the porous metallic material member 13 includes a first surface interconnecting with the frame 12 and a second surface located at the opposite side of the first surface interconnecting with the transparent protection plate 14. Furthermore member 13 is substantially a rectangular frame in shape corresponding to the front surface 122 of the frame 12. The first surface and the second surface of the porous metallic material member 13 are substantially parallel to the transparent protection plate 14 and the light output surface 111 of the liquid crystal display module 11 respectively. The porous metallic material member 13, the frame 12, and the transparent protection plate 14 can be fixed together by at least one of a piece of double-sided adhesive tape, a solid adhesive, and glue, or by at least one of a fastening member and a latching member.

Since the porous metallic material member 13 is foam-like and defines many pores interconnecting with each other, the porous metallic material member 13 can regulate ventilation between the interspace 15 and ambient environment while filtering out dust particles. The display device 10 prevents fogs forming on the transparent protection plate 14 and dust particles entering the interspace 15 simultaneously, thus maintaining a clear display. It should be pointed out that the effectiveness of filtering out the dust particles by the porous metallic material member 13 could be improved by decreasing a pore size of the porous metallic material member 13.

Figure 3:
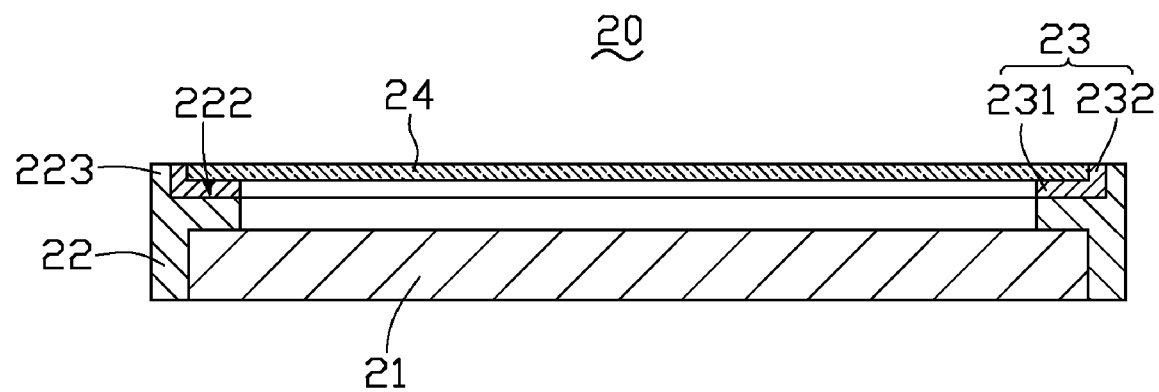
FIG. 3 is a side, cross-sectional view of a display device in accordance with a second preferred embodiment of the present invention.

Referring to FIG. 3, a display device 20 according to a second embodiment is shown. The display device 20 includes a liquid crystal display module 21, a frame 22, a porous metallic material member 23, and a transparent protection plate 24. The display device 20 is similar in principle to the display device 10 described above. However, the frame 22 has a front surface 222 and a flange portion 223 protruding forwardly from an outer edge of the front surface 222. The front surface 222 and the flange portion 223 cooperatively define a first room for receiving the porous metallic material member 23. The porous metallic material member 23 is engaged with the front surface 122 of the frame 22 in shape, and includes a bottom portion 231 and a bent portion 232 that is distal from a center of the display device 20. The bottom portion 231 and the bent portion 232 cooperatively define a second room for receiving the transparent protection plate 24. By using the first room and the second room to receive the porous metallic material member 23 and the transparent protection plate 24 respectively, the porous metallic material member 23 and the transparent protection plate 24 can be firmly fixed on the frame 22.

Figure 4:
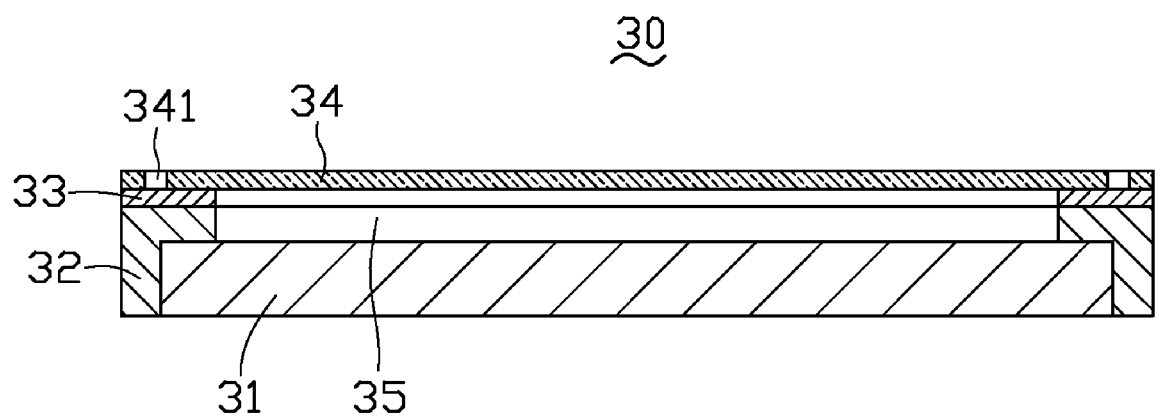
FIG. 4 is a side, cross-sectional view of a display device in accordance with a third preferred embodiment of the present invention.

Referring to FIG. 4, a display device 30 according to a third embodiment is shown. The display device 30 includes a liquid crystal display module 31, a frame 32, a porous metallic material member 33, and a transparent protection plate 34. The display device 30 is similar in principle to the display device 10 described above. However, the transparent protection plate 34 defines a plurality of through holes 341 around an edge of the transparent protection plate 34 adjacent the porous metallic material member 33. The through holes 341 are adopted to increase an interaction between ambient environment and the porous metallic material member 33, thereby improving a ventilation effectiveness and ventilation efficiency between ambient environment and an interspace 35 defined between the transparent protection plate 34 and the liquid crystal display module 31. It should be pointed out that the through holes 341 could be filled up with a porous metallic material as well.

Figure 5:
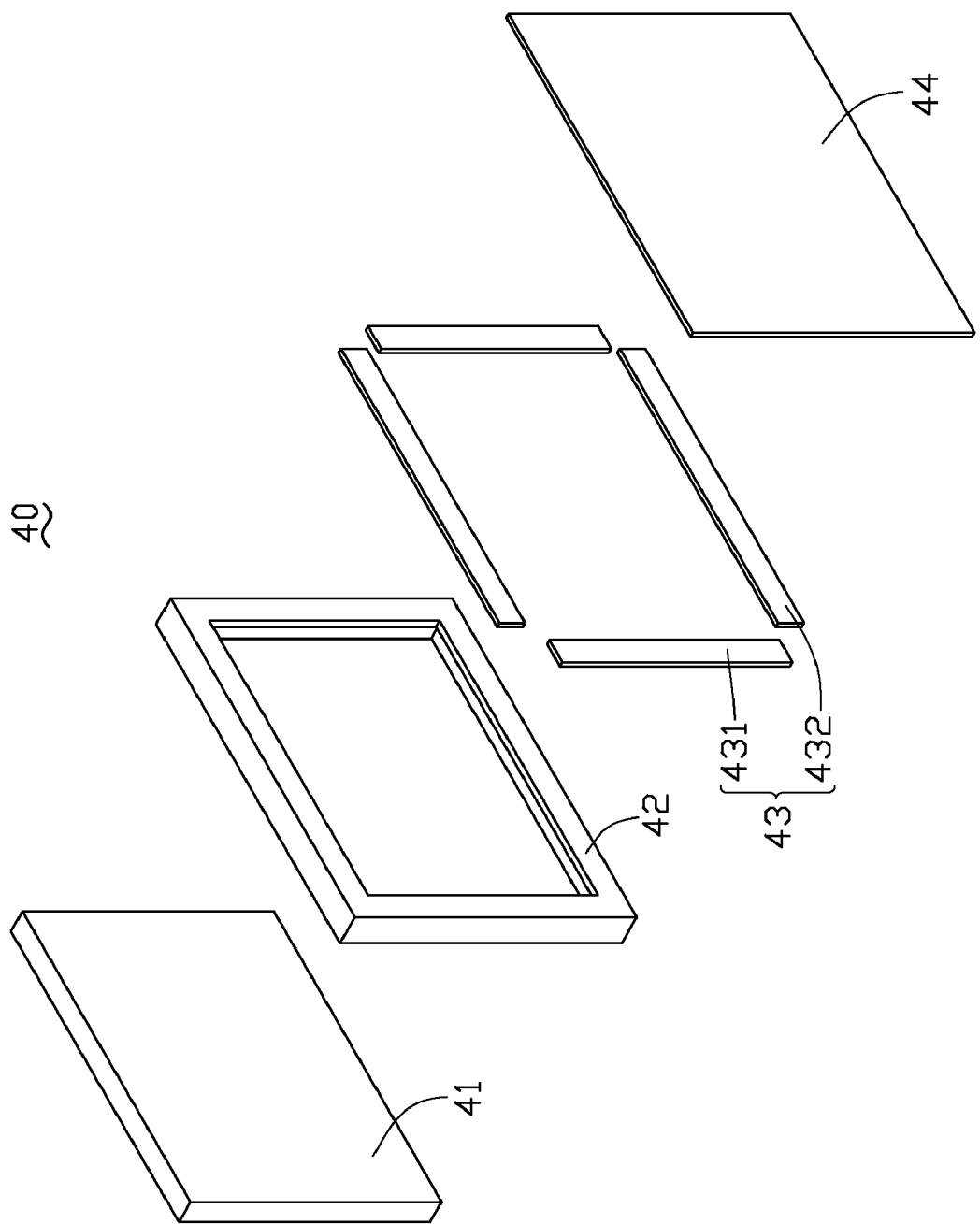
FIG. 5 is an exploded view of a display device in accordance with a fourth preferred embodiment of the present invention.

Referring to FIG. 5, a display device 40 according to a fourth embodiment is shown. The display device 40 includes a liquid crystal display module 41, a frame 42, a porous metallic material member 43, and a transparent protection plate 44. The display device 40 is similar in principle to the display device 10 described above. However, the porous metallic material member 43 is made of porous metallic material units 431, 432. In an illustrated embodiment, each of the porous metallic material units 431, 432 is an elongated rectangular sheet in shape. It can be understood that the porous metallic material member 43 can be made of one of the porous metallic material unit 431, 432, while some other subject are used to replace the rest porous metallic material unit 431, 432. The display device 40 may be cost efficient.

It is noted that the scope of the present display devices is not limited to the embodiments described above. For example, in the display device 10, the porous metallic material member 13 can be located between the front surface 122 of the frame 12 and light output surface 111 of the display module 11. In addition, the liquid crystal display module of the display device can be substituted by one of a plasma display module, a field emission display module, and an electroluminescent display module It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A display device, comprising:
a frame defining a receiving cavity;
a display module received in the receiving cavity of the frame;
a transparent protection plate configured on a light output side of the display module, the transparent protection plate and a light output surface of the display module being spaced apart from one another so that an interspace is defined between the transparent protection plate and the light output surface; and
a porous metallic material member located at an edge between the display module and the transparent protection plate to regulate ventilation between the interspace end outside while filtering out dust particles wherein the frame comprises a front surface and a flange portion protruding from the front surface, the front surface and the flange portion cooperatively define a room for receiving the porous metallic material member and the transparent protection plate.

2. The display device as claimed in claim 1, wherein the display module is selected from a group consisting of a liquid crystal display module, a plasma display module, a field emission display module, and an electroluminescent display module.

3. The display device as claimed in claim 1. wherein the transparent protection plate is made of a material selected from a group consisting of plastic, glass, and any combination thereof.

4. The display device as claimed in claim 1, wherein the porous metallic material member is made of one of a porous metallic material and a porous composite metallic material.

5. The display device as claimed in claim 4, wherein the porous metallic material is made of material selected from a group consisting of aluminium alloy, ferrous alloy, nickel alloy, magnesium alloy, and any combination thereof.

6. The display device as claimed in claim 1, wherein the porous metallic material member comprises a first surface interconnecting with the frame, and a second surface located at the opposite side of the first surface interconnecting with the transparent protection plate.

7. The display device as claimed in claim 1, wherein the transparent protection plate defines a plurality of through holes in at least one edge thereof corresponding to the porous metallic material member.

8. The display device as claimed in claim 1, wherein the frame, the transparent protection plate and the porous metallic material member are fixed together by at least one of a piece of double-sided adhesive tape, solid adhesive, and glue, or by at least one of a fastening member and a latching member.

9. The display device as claimed in claim 1, wherein the porous metallic material member is substantially a rectangular frame in shape.

10. The display device as claimed in claim 1, wherein the porous metallic material member is made of at least one porous metallic material unit, each of the at least one porous metallic material unit is an elongated rectangular sheet in shape.

11. A display device, comprising:
a frame comprising a front surface and a plurality of side rims extending rearwards from a periphery of the front surface, wherein the front surface defines a window, the front surface and the side rims cooperatively defines a receiving cavity under the front surface;
a display module having a light output surface confined in the receiving cavity;
a transparent protection plate located in front of the display module, the transparent protection plate and a light output surface of the display module being spaced apart from one another so that an interspace is defined between the transparent protection plate and the light output surface; and
a porous metallic material member located between the front surface of the frame and the transparent protection plate to regulate ventilation between the interspace and outside while filtering out dust particles wherein the frame further comprises a flange portion protruding from the front surface, the front surface and the flange portion cooperatively define a room for receiving the porous metallic material member and the transparent protection plate.

12. The display device as claimed in claim 11, wherein the transparent protection plate is made of a material selected from a group consisting of plastic, glass, and any combination thereof.

13. The display device as claimed in claim 11, wherein the porous metallic material member is made of one of a porous metallic material and a porous composite metallic material.

14. The display device as claimed in claim 11, wherein the transparent protection plate defines a plurality of through holes in at least one edge thereof corresponding to the porous metallic material member.

15. The display device as claimed in claim 11, wherein the porous metallic material member is substantially a rectangular frame in shape.

16. A display device, comprising:
a frame defining a receiving cavity;
a display module received in the receiving cavity of the frame;
a transparent protection plate configured on a light output side of the display module the transparent protection plate and a light output surface of the display module being spaced apart from one another so that an interspace is defined between the transparent protection plate and the light output surface; and
a porous metallic material member located exclusively throughout every edge between the display module and the transparent protection plate wherein the frame further comprises a flange portion protruding from the front surface, the front surface and the flange portion cooperatively define a room for receiving the porous metallic material member and the transparent protection plate.

* * * * *